US012566193B2

(12) United States Patent
Kim et al.

(10) Patent No.: US 12,566,193 B2
(45) Date of Patent: Mar. 3, 2026

(54) WAFER TESTING APPARATUS AND CONTROL METHOD THEREOF

(71) Applicant: Samsung Electronics Co., Ltd., Suwon-si (KR)

(72) Inventors: Chunghyun Kim, Suwon-si (KR); Cheolkyu Lim, Cheonan-si (KR); Byungwook Jeong, Cheonan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 73 days.

(21) Appl. No.: 18/606,516

(22) Filed: Mar. 15, 2024

(65) Prior Publication Data

US 2024/0319229 A1 Sep. 26, 2024

(30) Foreign Application Priority Data

Mar. 24, 2023 (KR) ......................... 10-2023-0039142
Apr. 20, 2023 (KR) ......................... 10-2023-0052209

(51) Int. Cl.
*G01R 31/28* (2006.01)
*G01R 1/067* (2006.01)
*G01R 1/073* (2006.01)

(52) U.S. Cl.
CPC ..... *G01R 1/06794* (2013.01); *G01R 1/07342* (2013.01); *G01R 31/2831* (2013.01)

(58) Field of Classification Search
CPC .............. G01R 1/0483; G01R 1/06794; G01R 31/2601; G01R 31/2893
See application file for complete search history.

(56) References Cited

U.S. PATENT DOCUMENTS

| | | | | |
|---|---|---|---|---|
| 6,037,793 A | * | 3/2000 | Miyazawa ......... | G01R 31/2831 324/762.05 |
| 6,140,828 A | * | 10/2000 | Iino ................... | G01R 31/2887 324/750.22 |
| 6,297,656 B1 | | 10/2001 | Kobayashi et al. | |
| 7,068,056 B1 | * | 6/2006 | Gibbs ................ | G01R 31/2891 324/750.16 |

(Continued)

FOREIGN PATENT DOCUMENTS

| | | |
|---|---|---|
| JP | 3423979 B2 | 7/2003 |
| KR | 10-0262655 B1 | 9/2000 |

(Continued)

*Primary Examiner* — Tung X Nguyen
(74) *Attorney, Agent, or Firm* — Harnes, Dickey & Pierce, P.L.C.

(57) ABSTRACT

A wafer testing apparatus includes a probe board disposed above a chamber, a wafer chuck disposed below the probe board and configured to support the wafer, a camera located between the probe board and the wafer chuck and configured to capture images of probe imaging points arranged on a lower surface of the probe board and wafer imaging points arranged on an upper surface of the wafer, and a controller electrically connected to the camera and configured to adjust a tilt of the probe board on the basis of image information acquired by the camera. The probe imaging points include a plurality of probe outer imaging points arranged in a rhombic pattern on the lower surface of the probe board, and the wafer imaging points include a plurality of wafer outer imaging points arranged in a rhombic pattern on the upper surface of the wafer.

20 Claims, 19 Drawing Sheets

(56)     References Cited

U.S. PATENT DOCUMENTS

| 7,542,098 | B2 | 6/2009 | Mamba et al. |
| 11,486,899 | B2 | 11/2022 | Tsai et al. |

FOREIGN PATENT DOCUMENTS

| KR | 10-0716056 | B1 | 5/2007 |
| KR | 10-0735783 | B1 | 7/2007 |
| KR | 10-1017350 | B1 | 2/2011 |
| KR | 10-1711111 | B1 | 2/2017 |
| KR | 10-2465584 | B1 | 12/2019 |
| KR | 2022-0069191 | A | 5/2022 |

* cited by examiner

WAFER TESTING APPARATUS AND CONTROL METHOD THEREOF

CROSS-REFERENCE TO RELATED APPLICATION

This application is based on and claims priority under 35 U.S.C. § 119 to Korean Patent Application No. 10-2023-0039142, filed on Mar. 24, 2023, and 10-2023-0052209, filed on Apr. 20, 2023, in the Korean Intellectual Property Office, the disclosures of each of which are incorporated by reference herein in their entireties.

BACKGROUND

Various example embodiments relate to a wafer testing apparatus and/or to a control method thereof, and more particularly, to a wafer testing apparatus for testing defects on semiconductor substrates and/or to a control method thereof.

Semiconductor devices may be manufactured by a process of forming patterns on wafers and a process of assembling the patterned wafers into individual singulated and diced unit chips. Test processes of testing electrical properties of unit semiconductor devices constituting the wafers may be performed between the plurality of processes.

The test processes may be performed thereon to determine whether defective semiconductor devices are present or not, along with which semiconductor devices are defective, from among the semiconductor devices that constitute or are included in the wafers. A test apparatus may be used which applies electrical signals to semiconductor devices during test processes and determines whether semiconductor devices are defective or not on the basis of signals checked from the applied electrical signals.

SUMMARY

Various example embodiments provide a wafer testing apparatus capable of precisely or more precisely measuring a tilt of a probe board and thus more accurately aligning the probe board with a wafer. This may improve the contact between the probe board and the wafer, which may more accurately test the semiconductor devices or die included on the wafer.

Alternatively or additionally, various example embodiments may also provide a wafer testing apparatus capable of measuring a tilt of a wafer provided on a chuck stage in addition to the tilt of the probe board, and thus more accurately aligning the probe board with the wafer.

According to various example embodiments, there is provided a wafer testing apparatus for a wafer to be tested and having a chamber providing a space for testing electrical properties of semiconductor devices that are on the wafer, the wafer testing apparatus including a probe board above the chamber, a wafer chuck below the probe board and configured to support the wafer, a camera between the probe board and the wafer chuck and configured to capture images of probe imaging points on a lower surface of the probe board and wafer imaging points on an upper surface of the wafer, and a controller electrically connected to the camera and configured to adjust a tilt of the probe board on the basis of image information acquired by the camera. The probe imaging points include a plurality of probe outer imaging points arranged in a rhombic pattern on the lower surface of the probe board, and the wafer imaging points include a plurality of wafer outer imaging points arranged in a rhombic pattern on the upper surface of the wafer.

Alternatively or additionally according to various example embodiments, there is provided a wafer testing apparatus for a wafer to be tested and having a chamber providing a space for testing electrical properties of semiconductor devices that are on the wafer, the wafer testing apparatus including a probe board arranged to be above the wafer and having a lower surface to face the wafer, a camera below the probe board and configured to acquire image information by capturing images of a plurality of wafer imaging points on an upper surface of the wafer and a plurality of probe imaging points on the lower surface of the probe board, a driving device configured to adjust a tilt of the probe board, and a controller configured to transmit an electrical signal to the driving device on the basis of the image information acquired by the camera. The plurality of probe imaging points include a first probe imaging point located at the center of the lower surface of the probe board, a pair of second probe imaging points arranged in a first direction with the first probe imaging point therebetween at the outer circumference of the lower surface of the probe board, and a pair of third probe imaging points arranged in a second direction perpendicular to the first direction with the first probe imaging point therebetween at the outer circumference of the lower surface of the probe board.

Alternatively or additionally according to various example embodiments, there is provided a method of controlling a wafer testing apparatus for testing electrical properties of semiconductor devices formed on a wafer, the method including placing a probe board on a probe card seat, capturing an image of probe imaging points arranged on a lower surface of the probe board using a camera positioned between the probe board and the wafer, capturing an image of wafer imaging points arranged on an upper surface of the wafer using the camera, and generating data about tilts of the probe board and the wafer on the basis of the image of the probe imaging points and the image of the wafer imaging points acquired by the camera.

BRIEF DESCRIPTION OF THE DRAWINGS

Some example embodiments will be more clearly understood from the following detailed description taken in conjunction with the accompanying drawings in which:

FIG. 2 is a perspective view illustrating main internal components provided in a main body of the wafer testing apparatus according to various example embodiments;

FIG. 6 is a configuration diagram schematically illustrating the relationship between a controller, a camera, and a driving device which are provided in the wafer testing apparatus according to various example embodiments;

DETAILED DESCRIPTION OF VARIOUS EXAMPLE EMBODIMENTS

Hereinafter, embodiments are described in detail with reference to the accompanying drawings. The embodiments of various example embodiments may, however, be embodied in different forms and should not be construed as limited to the embodiments set forth herein. Rather, these embodiments are provided so that this disclosure will be thorough and complete, and will fully convey the scope of various example embodiments to those skilled in the art.

Figure 1:
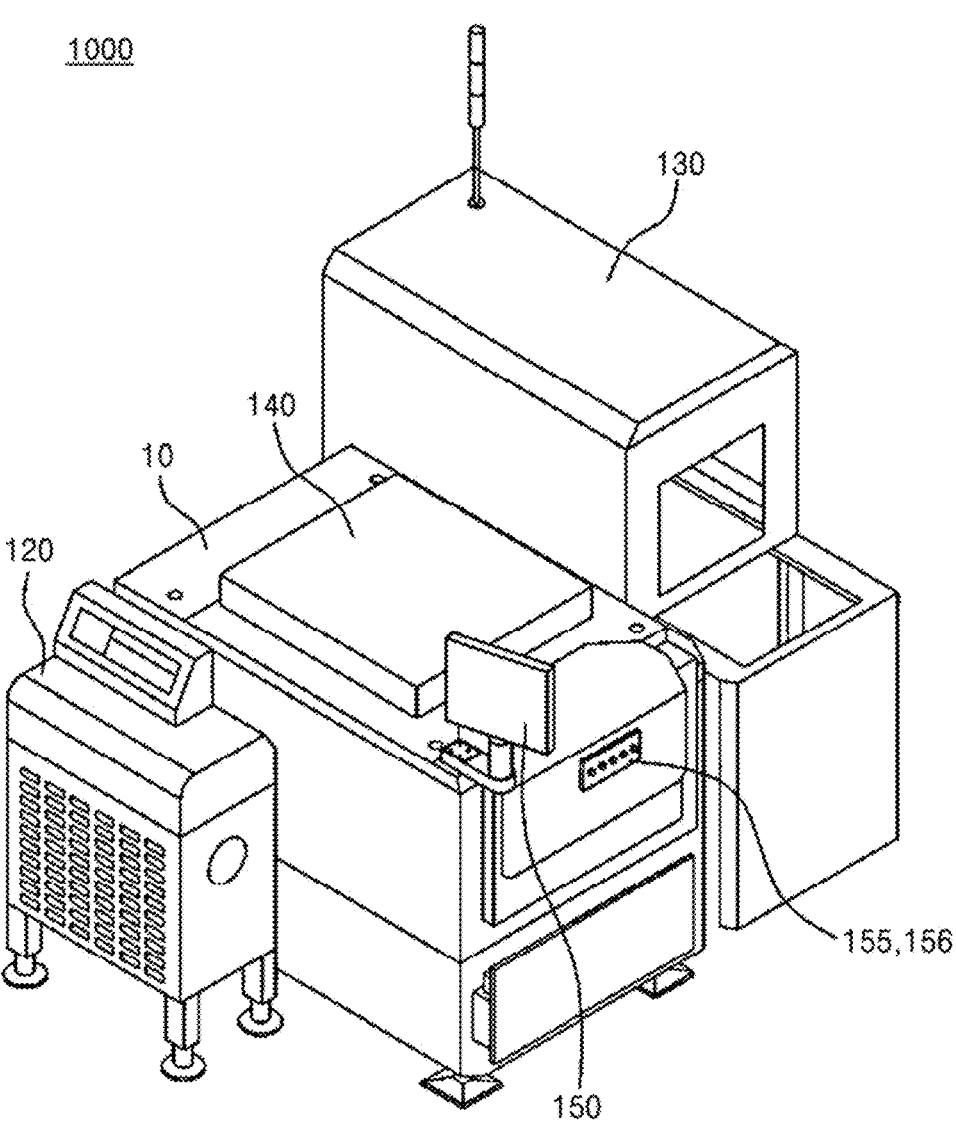
FIG. 1 is a perspective view illustrating the appearance of a wafer testing apparatus according to various example embodiments.

FIG. 1 is a perspective view illustrating the appearance of a wafer testing apparatus 1000 according to various example embodiments.

Referring to FIG. 1, the wafer testing apparatus 1000 according to some example embodiments may include a main body 10, a laser beam provider 120, and a wafer transfer module 130. In some example embodiments, the wafer testing apparatus 1000 may include a test module 140 and a monitor 150 disposed above the main body 10; however, example embodiments are not limited thereto.

The laser beam provider 120 according to some example embodiments may be installed on one side of the main body 10 and may generate a laser beam so as to provide the laser beam to the inside of the main body 10. For example, the laser beam provider 120 may be installed outside the main body 10. When the laser beam provider 120 is installed outside the main body 10, one or more of the inspection, maintenance, and replacement of the laser beam provider 120 may be more easily performed regardless of the main body 10. Since the laser beam provider 120 includes a lamp that emits high-temperature heat, the laser beam provider 120 needs to or is expected to be inspected and maintained more frequently than the main body 10. Therefore, when the laser beam provider 120 is installed outside the main body 10, the convenience and/or the efficiency of work may be improved.

The wafer transfer module 130 may be located on the other side of the main body 10 and may provide a wafer W to the inside of the main body 10. The laser beam provider 120 and the wafer transfer module 130 may be located on opposite sides of the main body 10. Accordingly, it is or may be possible to more efficiently utilize the space occupied by the wafer testing apparatus 1000, to reduce or minimize the movement of wafers W and/or of operators or technicians, and/or to more efficiently perform test processes and/or maintenance work.

The test module 140 may provide a circuit environment for testing the wafer W loaded into the main body 10. The test module 140 is described below in more detail with reference to other drawings.

In some example embodiments, the wafer W may be a 300 mm diameter wafer; however, example embodiments are not limited thereto. In some example embodiments, the wafer W may be a 200 mm diameter wafer, or a 450 mm diameter wafer. In some example embodiments, the wafer W may have a notch and/or a flat on the edge thereof; example embodiments are not limited thereto.

The monitor 150 may visually provide image information and may map information of a probe card 190 for testing the wafer W. The functions and/or operations of the monitor 150 are also described below.

Although the monitor 150 is illustrated as being attached to the main body 10, example embodiments are not limited thereto. In some examples, there may alternatively or additionally be another monitor (not shown) and/or display device (not shown), such as but not limited to a tablet and/or a smart phone, that visually provides image information and/or map information of the probe card 190. The other monitor and/or display device may be connected, e.g., wired and/or wirelessly connected, to the main body. Example embodiments are not limited thereto.

A control part 155 may be installed inside the main body 10. The control part 155 may command and/or may control the operation of the wafer testing apparatus 1000. The functions and operations of the control part 155 are also described below. A control panel 156 capable of communicating with the control part 155 may be installed on the outer front surface of the main body 10. Various operation buttons capable of controlling driving, operation, and termination of the wafer testing apparatus 1000 may be arranged on the control panel 156. For example, an operator may drive, operate, or terminate the wafer testing apparatus 1000 or transmit commands to the control part 155 by controlling components of the control panel 156.

Figure 2:
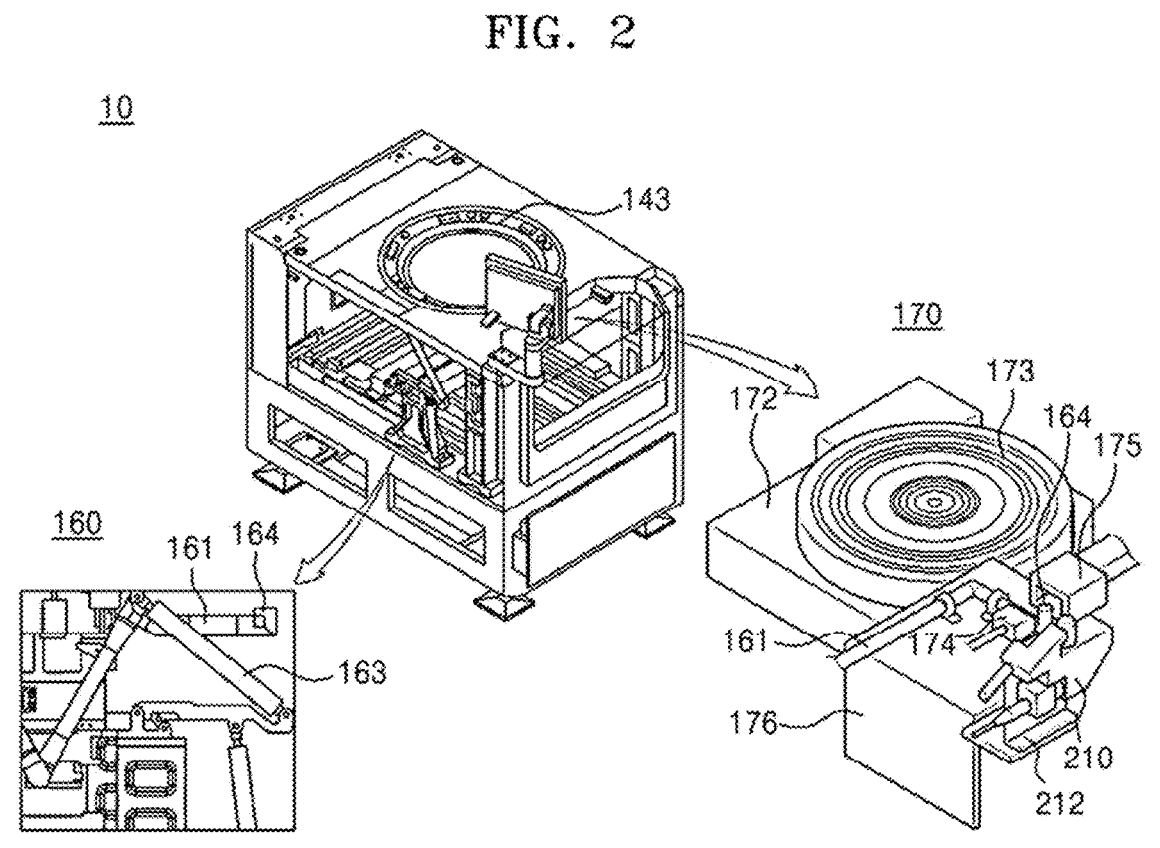

FIG. 2 is a perspective view illustrating main internal components provided in the main body 10 of the wafer testing apparatus according to various example embodiments.

Referring to FIG. 2, the main body 10 of the wafer testing apparatus 1000 according to some example embodiments may include a laser beam delivering part 160 and a stage part 170.

The stage part 170 may include a chuck supporting part 172. According to some example embodiments, a wafer chuck 173 may be installed on the chuck supporting part 172. In some example embodiments, an air blowing port 174, an exhausting part 175, and a camera 210 may be positioned above the chuck supporting part 172.

The wafer chuck 173 may provide a space in which the wafer W is placed and may support the wafer W. In some example embodiments, the wafer chuck 173 may be electrically grounded; however, example embodiments are not limited thereto, and in some cases the wafer chuck 173 may be in a floating state.

The air blowing port 174 may provide air flow. The exhausting part 175 may suction air. For example, one or more of air, contaminants, and the like inside the main body 10 may be discharged to the outside of the main body 10 through the exhausting part 175 along the air flow of the air blowing port 174. The exhausting part 175 may include a suction pump. The air blowing port 174 and the exhausting part 175 may be installed on an air flow supporting part 176. For example, the air flow supporting part 176 may move independently and be positioned above the stage part 170 or may move to another position.

The camera 210 may capture images of the lower surface of the probe card 190 (see FIG. 3) as well as the upper surface of the wafer W (see FIG. 3) which are described below. The functions and operations of the camera 210 are described below in more detail. The camera 210 may be installed on a camera supporting part 212. For example, the camera supporting part 212 may be independently positioned above the stage part 170 and/or may move to another position.

The laser beam delivering part 160 may include a laser beam delivering passage 161 and a controlling rod 163. The laser beam delivering part 160 may receive a laser beam from the laser beam provider 120 and transmit the laser beam to a laser beam irradiating part 164.

The laser beam irradiating part 164 may be installed at an end of the laser beam delivering passage 161. The laser beam irradiating part 164 may emit the laser beam in the upward direction. The laser beam irradiating part 164 may be positioned between the air blowing port 174 and the exhausting part 175. The controlling rod 163 may move, fix, and/or support the laser beam delivering passage 161. The laser beam delivering passage 161 and the controlling rod 163 may include a plurality of flexible joints. The laser beam irradiating part 164 may be fixed to any one of the stage part 170, the air flow supporting part 176, and the camera supporting part 212. Accordingly, the laser beam irradiating part 164 may move horizontally and/or rise and/or descend vertically according to the movement of the stage part 170, the air flow supporting part 176, and the camera supporting part 212.

According to some example embodiments, the air blowing port 174, the laser beam irradiating part 164, and the camera 210 may be fixed on the stage part 170 or installed thereon to be movable independently.

A probe card seat 143 may be installed in the upper portion of the main body 10. For example, the test module 140 may be positioned on the probe card seat 143. The probe card seat 143 may have a cavity. For example, the probe card seat 143 may have a cavity or manhole shape, and the outer arc thereof may have a stepped shape. The probe card seat 143 is described below in more detail.

Figure 3:
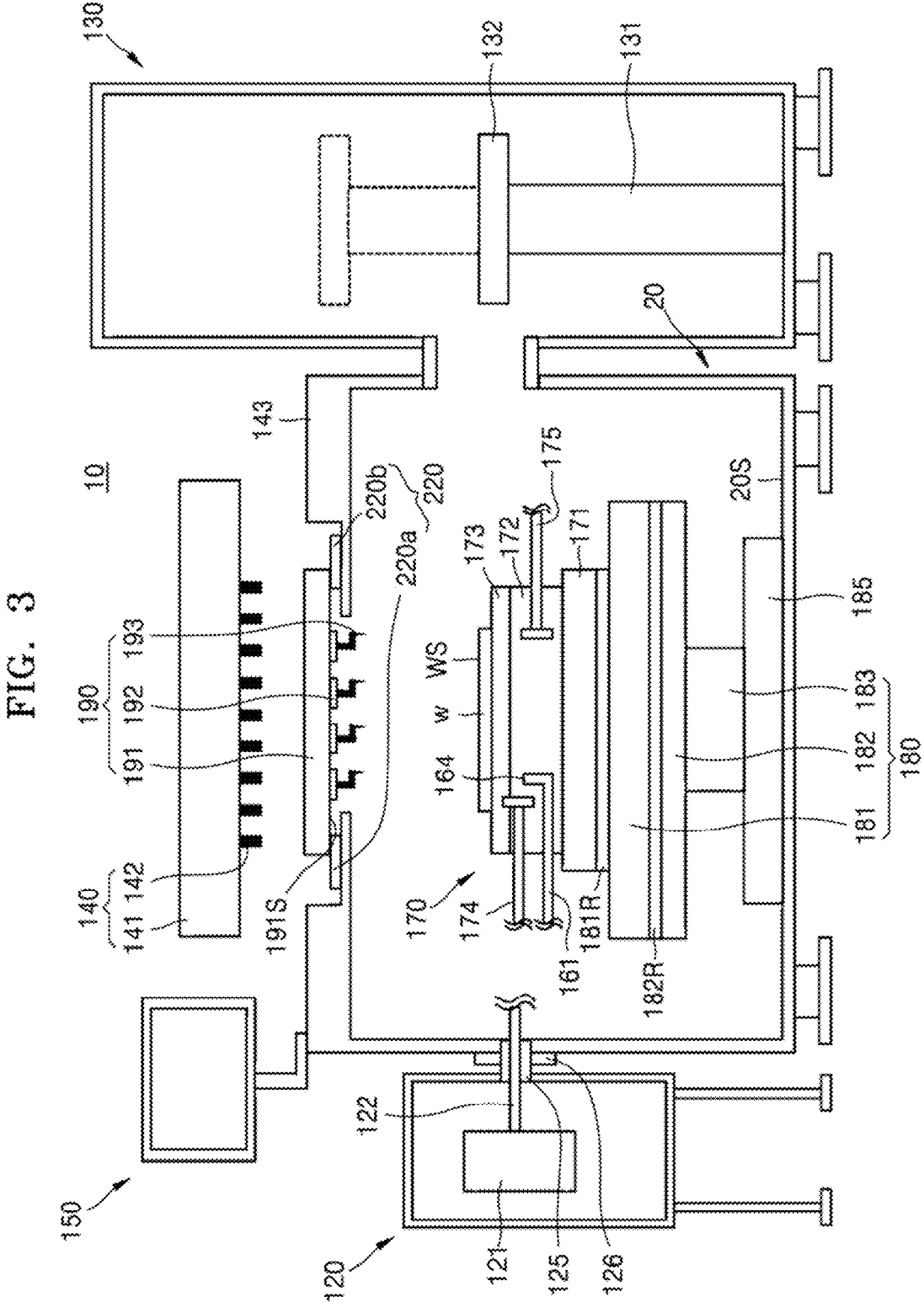
FIG. 3 is a schematic internal cross-sectional view of the main body of the wafer testing apparatus according to various example embodiments.

FIG. 3 is a schematic internal cross-sectional view of the main body 10 of the wafer testing apparatus according to various example embodiments. Referring to FIG. 3, the main body 10 of the wafer testing apparatus according to various example embodiments may include the stage part 170 and a stage moving part 180 therein and the probe card seat 143 in the upper portion thereof. The stage moving part 180 may be installed on a stage supporting part 185. The wafer testing apparatus according to some example embodiments may include a chamber 20 that provides a space for testing electrical properties of semiconductor devices formed on the wafer W to be tested.

The laser beam provider 120 may include a laser beam generating part 121 and a laser beam transmitting tube 122. The laser beam generated by the laser beam generating part 121 may be provided into the main body 10 through the laser beam transmitting tube 122. For example, the laser beam may be provided to the laser beam delivering part 160 (see FIG. 2). A sealing material 125 may be used to form a seal between the laser beam provider 120 and the main body 10. In addition, a sensor 126 may be attached between the laser beam provider 120 and the main body 10. The sealing material 125 may seal and block or at least partially block the inside and outside of the main body 10 and/or the laser beam provider 120 and prevent or reduce leakage of the laser beam. The sensor 126 may sense pressure and/or light, and may detect damage to the sealing material 125 and/or seal or the leakage of light.

The wafer transfer module 130 may include a raising/lowering part 131 and a table 132. The table 132 may be raised and lowered by the raising/lowering part 131 while loading the wafer W thereon. The wafer W may be loaded/unloaded from the outside to the inside or from the inside to the outside of the main body 10 through the wafer transfer module 130.

The test module 140 may include a test head 141 and pogo pins 142. The test head 141 may include a test circuit and come into contact with the probe card 190 through the pogo pins 142 to exchange electrical signals with the probe card 190. The diagram illustrates that the test module 140 is slightly raised in order to easily understand various example embodiments. Also, the diagram illustrates a state in which the probe card 190 sits on the probe card seat 143.

According to some example embodiments, the probe card 190 including a probe board 191 may be disposed above the chamber 20.

The probe card 190 may include the probe board 191, one or a plurality of device under tests (DUTs) 192, and probe pins 193. The DUTs 192 may have sizes and/or shapes corresponding to the semiconductor chips or dice on the wafer W. The probe board 191 may include a printed circuit board. Each of the DUTs 192 may have a size and/or a shape corresponding to one semiconductor chip on the wafer W (e.g., of a die on the wafer W, or a die and surrounding scribe on the wafer W). The probe pins 193 may be aligned with input/output pads of the semiconductor chips. According to various example embodiments, the DUTs 192 do not have shapes corresponding to all semiconductor chips on the wafer W. For example, the DUTs 192 may be arranged to correspond to one or some of the semiconductor chips on the wafer W. The arrangement of the DUTs 192 is described below in more detail. In some example embodiments, the DUTs 192 may be arranged in a rectangular lattice; however, example embodiments are not limited thereto. In some example embodiments, the DUTSs 192 may be arranged in a polyomino shape. The number of DUTs 192 may be a square number or a composite number; however, example embodiments are not limited thereto.

The stage moving part 180 may include an X-axis moving part 181, a Y-axis moving part 182, and a Z-axis moving part 183. The X-axis moving part 181 and the Y-axis moving part 182 may move the stage part 170 along rails 181R and 182R extending in the X-axis and Y-axis directions, respectively. The Z-axis moving part 183 may have a raising/lowering function. For example, the stage moving part 180 may support and move the stage part 170 in the X-axis, Y-axis, and Z-axis directions. The positions of the X-axis moving part 181 and the Y-axis moving part 182 may be interchanged therebetween. There may or may not be a rotation moving part to rotate the stage part 170.

For example, when each of the chuck supporting part 172, the laser beam irradiating part 164, the exhausting part 175, and the camera 210 (hereinafter, see FIG. 2) is fixed on a base 171, the wafer chuck 173, the laser beam irradiating part 164, the exhausting part 175, and the camera 210 may be simultaneously moved in the X-axis, Y-axis, and Z-axis directions according to the driving of the stage moving part 180. Alternatively or additionally, all of the chuck supporting part 172, the laser beam irradiating part 164, the exhausting part 175, and the camera 210 may be independently moved without being fixed on the base 171. The wafer chuck 173 may be disposed on the chuck supporting part 172. To simplify the diagram, the air flow supporting part 176 and the camera supporting part 212 in FIG. 2 are omitted. The wafer chuck 173 may be disposed below the probe board 191 and configured to support the wafer W.

The laser beam irradiating part 164 may diversely change irradiation directions using a separate driving device. The diagram illustrates that the irradiation direction of the laser beam irradiating part 164 is fixed. When the irradiation direction of the laser beam irradiating part 164 is fixed, the laser beam may be emitted to various positions by the X-axis moving part 181, the Y-axis moving part 182, and/or the Z-axis moving part 183.

Figure 4:
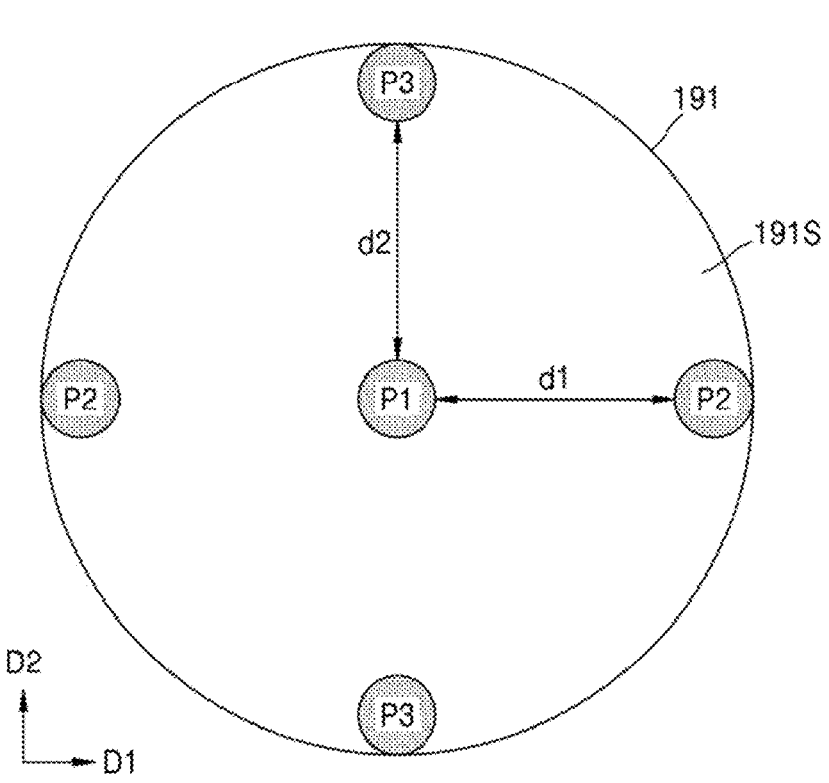
FIG. 4 is a plan view illustrating a plurality of probe imaging points arranged on the lower surface of a probe board.

FIG. 4 is a plan view illustrating a plurality of probe imaging points arranged on a lower surface 191S of the probe board 191.

Referring to FIG. 4, a plurality of probe imaging points P1, P2, and P3 (also referred to as first to third probe imaging points P1, P2, and P3) may be arranged on the lower surface 191S of the probe board 191. The probe imaging points P1, P2, and P3 may include points of which images are captured by the camera 210 (hereinafter, see FIG. 2). The camera 210 disposed on the lower surface 191S of the probe board 191 may capture an image of the lower surface 191S of the probe board 191 in order to measure a tilt of the probe board 191. Here, the camera 210 may capture an image of specific points rather than all regions of the lower surface 191S of the probe board 191. Accordingly, the plurality of probe imaging points P1, P2, and P3 may be or may correspond to points of which an image is captured to measure the tilt of the probe board 191.

According to some example embodiments, the probe board 191 may have a circular lower surface. However, example embodiments are not necessarily limited thereto, and the probe board 191 may have a lower surface having various shapes, such as a square, a rectangle, or a polygon, according to embodiments. The first probe imaging point P1 may be located at the center of the lower surface 191S of the probe board 191. The second and third probe imaging points P2 and P3 may be arranged in a rhombic (or kite) pattern on the lower surface 191S of the probe board 191 with the first probe imaging point P1 therebetween.

A pair of second probe imaging points P2 may be arranged in a first direction D1 with the first probe imaging point P1 therebetween; the pair of second probe imaging points P2 may be arranged at an outer edge, e.g., the outer circumference of the lower surface 191S of the probe board 191. In this case, each of the pair of second probe imaging points P2 may be spaced from the first probe imaging point P1 by a first distance d1. Also, a pair of third probe imaging points P3 may be arranged in a second direction D2 with the first probe imaging point P1 therebetween, with the pair arranged at the outer circumference of the lower surface 191S of the probe board 191. In this case, each of the pair of third probe imaging points P3 may be spaced from the first probe imaging point P1 by a second distance d2. The first direction D1 may represent a direction parallel to the lower surface 191S of the probe board 191 and the second direction D2 may represent a direction parallel to the lower surface 191S of the probe board 191 and perpendicular to the first direction D1. According to some example embodiments, the first distance d1 may be substantially the same as the second distance d2; however, example embodiments are not limited thereto, and the first distance d1 may be greater than or less than the second distance d2.

According to some example embodiments, as the area of the lower surface 191S of the probe board 191 increases, the degree of bending of the probe board 191 may increase. Accordingly, unevenness may occur on the lower surface 191S of the probe board 191 due to the bending. Here, the degree of bending may be greatest at the outermost region of the lower surface 191S of the probe board 191. Therefore, the second and third probe imaging points P2 and P3 are arranged on the outer circumference of the lower surface 191S of the probe board 191, and the image of the outer circumference of the lower surface 191S of the probe board 191 may be captured. The image of the outer circumference of the lower surface 191S of the probe board 191 is captured, and thus, it may be possible to accurately or more accurately measure the vertical level of the most bendable outermost portion of the probe board 191.

FIG. 4 illustrates that the plurality of probe imaging points P1, P2, and P3 have a circular shape. However, this is for convenience of description, and example embodiments are not limited thereto.

Figure 5:
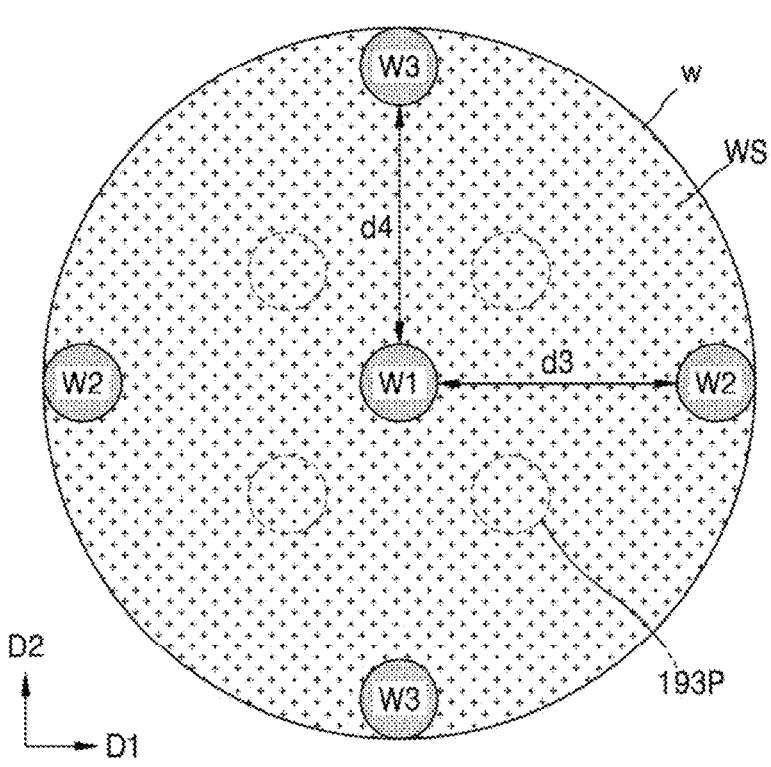
FIG. 5 is a plan view illustrating a plurality of wafer imaging points arranged on an upper surface of a wafer.

FIG. 5 is a plan view illustrating a plurality of wafer imaging points arranged on an upper surface WS of the wafer W.

Referring to FIG. 5, a plurality of wafer imaging points W1, W2, and W3 (also referred to as first to third wafer imaging points W1, W2, and W3) may be arranged on the upper surface WS of the wafer W. The plurality of wafer imaging points W1, W2, and W3 may include points of which images are captured by the camera 210 (hereinafter, see FIG. 2). The camera 210 disposed on the upper surface WS of the wafer W may capture an image of the upper surface WS of the wafer W in order to measure a tilt of the wafer W placed on the wafer chuck 173 (hereinafter, see FIG. 2). Here, the camera 210 may capture an image of specific points rather than all regions of the upper surface WS of the wafer W. Accordingly, the plurality of wafer imaging points W1, W2, and W3 may be points of which an image is captured to measure the tilt of the wafer W.

According to some example embodiments, the wafer W may have a circular upper surface. However, example embodiments are not necessarily limited thereto, and the wafer W may have an upper surface having various shapes, such as a square, a rectangle, an oval, or a polygon, according to embodiments. The first wafer imaging point W1 may be located at the center of the upper surface WS of the wafer W. The second and third wafer imaging points W2 and W3 may be arranged in a rhombic pattern (or kite pattern) on the upper surface WS of the wafer W with the first wafer imaging point W1 therebetween.

A pair of second wafer imaging points W2 may be arranged in a first direction D1 with the first wafer imaging point W1 therebetween at the outer circumference of the upper surface WS of the wafer W. In this case, each of the pair of second wafer imaging points W2 may be spaced from the first wafer imaging point W1 by a third distance d3. A pair of third wafer imaging points W3 may be arranged in a second direction D2 with the first wafer imaging point W1 therebetween at the outer circumference of the upper surface WS of the wafer W. In this case, each of the pair of third wafer imaging points W3 may be spaced from the first wafer imaging point W1 by a fourth distance d4, which may be the same as or different form the third distance d3, and may be less than the first distance d1. The first direction D1 may represent a direction parallel to the upper surface WS of the wafer W and the second direction D2 may represent a direction parallel to the upper surface WS of the wafer W and perpendicular to the first direction D1. According to some example embodiments, the third distance d3 may be substantially the same as the fourth distance d4.

According to some example embodiments, the camera 210 may capture not only the image of the lower surface 191S of the probe board 191 but also the image of the upper surface WS of the wafer W. As the camera 210 captures the image of the outer circumference of the upper surface WS of the wafer W, it is or may be possible to measure how much the wafer W is tilted relative to a horizontal plane parallel to the lower surface of the chamber 20 (hereinafter, see FIG. 3). A tilt correction value for the probe board 191 to be aligned with the wafer W may be more accurately measured by measuring both the tilt of the wafer W and the tilt of the probe board 191. The corrected tilt may help in the process of testing and fabricating semiconductor devices.

According to some example embodiments, a plurality of pin contact points 193P may be arranged on the upper surface WS of the wafer W. The pin contact points 193P may represent points at which the probe pins 193 are brought into contact with the upper surface WS of the wafer W. As illustrated in FIG. 5, the pin contact points 193P may not overlap the plurality of wafer imaging points W1, W2, and W3. However, example embodiments are not necessarily limited thereto, and the pin contact points 193P may overlap the plurality of wafer imaging points W1, W2, and W3 according to embodiments.

Figure 6:
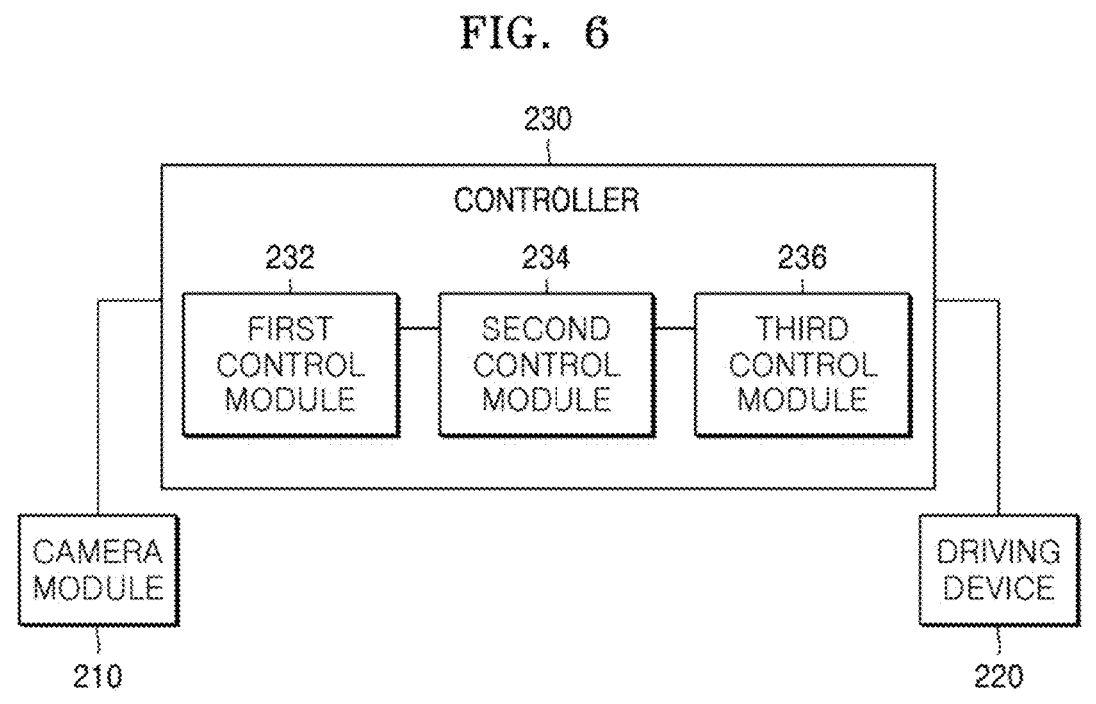

FIG. 6 is a configuration diagram schematically illustrating the relationship between the camera 210, a driving device 220, a controller 230, which are provided in the wafer testing apparatus according to various example embodiments. For convenience of description, a description is given below with reference to FIGS. 3 to 5 together.

According to some example embodiments, the controller 230 of the wafer testing apparatus is electrically connected to the camera 210 and the driving device 220, and thus, electrical signals may be exchanged therebetween. The controller 230 of the wafer testing apparatus may include a first control module 232, a second control module 234, and a third control module 236. The controller 230 may include an image processor. The controller 230 may compare (e.g., may correlate) the stored image with the image received from the camera 210 using the image processor, and may issue various commands according to the comparison result. For example, the controller 230 may issue a driving command to the driving device 220 and instruct the laser beam provider 120 (see FIG. 3) and/or the laser beam irradiating part 164 (see FIG. 2) to emit the laser beam. Also, the controller 230 may store the image received from the camera 210 and/or may store coordinates of the image captured by the camera 210. For example, the controller 230 may generate image data and create map data that includes the coordinates and/or images of the probe imaging points P1, P2, and P3 and the wafer imaging points W1, W2, and W3. The controller 230 may include a separate storage device and may communicate with a separate server system to exchange data with the separate server system. Hereinafter, a method of storing and processing the image data in the controller 230 is described in detail.

According to some example embodiments, the first control module 232 may receive the images, captured by the camera 210, of the plurality of probe imaging points P1, P2, and P3 arranged on the lower surface 191S of the probe board 191. Also, the first control module 232 may receive the images, captured by the camera 210, of the plurality of wafer imaging points W1, W2, and W3 arranged on the upper surface WS of the wafer W. The first control module 232 may be configured to generate first data on the basis of the images of the plurality of probe imaging points P1, P2, and P3 and the plurality of wafer imaging points W1, W2, and W3. The first data may include the image data of the plurality of probe imaging points P1, P2, and P3 arranged on the lower surface 191S of the probe board 191 or the map data that includes the coordinates and/or images thereof. In addition, the first data may also include the image data of the plurality of wafer imaging points W1, W2, and W3 arranged on the upper surface WS of the wafer W or the map data that includes the coordinates and/or images thereof. The first control module 232 may include a separate storage device and may also communicate with a separate server system to exchange data. The first data generated by the first control module 232 may be transmitted to the second control module 234.

According to various example embodiments, the controller 230 may not include a separate first control module 232. In this case, the camera 210 optically recognizes the images of the plurality of probe imaging points P1, P2, and P3 and the plurality of wafer imaging points W1, W2, and W3, and then may convert the images into digital data to generate the first data.

According to some example embodiments, the second control module 234 is electrically connected to the first control module 232 and may be configured to generate second data about angles, at which the probe board 191 and the wafer W are tilted, on the basis of the first data received from the first control module 232. For example, the second control module 234 may include an information processing device that stores the first data received from the first control module 232 and reads the first data. The second data generated by the second control module 234 about the angles, at which the probe board 191 and the wafer W are tilted, may include angles at which the probe board 191 and the wafer W are tilted relative to a virtual horizontal plane parallel to a lower surface 20S of the chamber 20.

According to some example embodiments, the third control module 236 may be configured to control the driving device 220 by receiving the second data about the tilt angles of the probe board 191 and the wafer W. The third control module 236 may calculate parameters for controlling the driving device 220 on the basis of the second data received from the second control module 234. For example, the third control module 236 may calculate control parameters of the driving device 220 for rotating the probe board 191 on the basis of the information about the tilt directions and angles of the probe board 191 and the wafer W. The third control module 236 may include an information processing device that stores the data received from the second control module 234 and reads the stored data.

The driving device 220 may extend in the vertical direction (e.g., a direction perpendicular to the upper surface WS of the wafer W) to adjust the tilt of the probe board 191. For convenience of description of the driving device 220, a description is given below with reference to FIG. 3. Specifically, the driving device 220 may include a first driving unit 220a and a second driving unit 220b, and each of the first driving unit 220a and the second driving unit 220b may include a motor such as a linear motor (not illustrated). The first driving unit 220a and the second driving unit 220b may be disposed below the probe board 191 and face each other with the probe board 191 therebetween. The first driving unit 220a may be provided below the probe board 191 and positioned on one side portion of the lower surface 191S of the probe board 191 and the second driving unit 220b may be positioned on the other side portion of the lower surface 191S of the probe board 191 on the opposite side from the one side portion thereof. Each of the first driving unit 220a and the second driving unit 220b may extend in the vertical direction. When the extended length of the first driving unit 220a and the extended length of the second driving unit 220b are different from each other, the tilt of the probe board 191 is changed.

Figure 7:
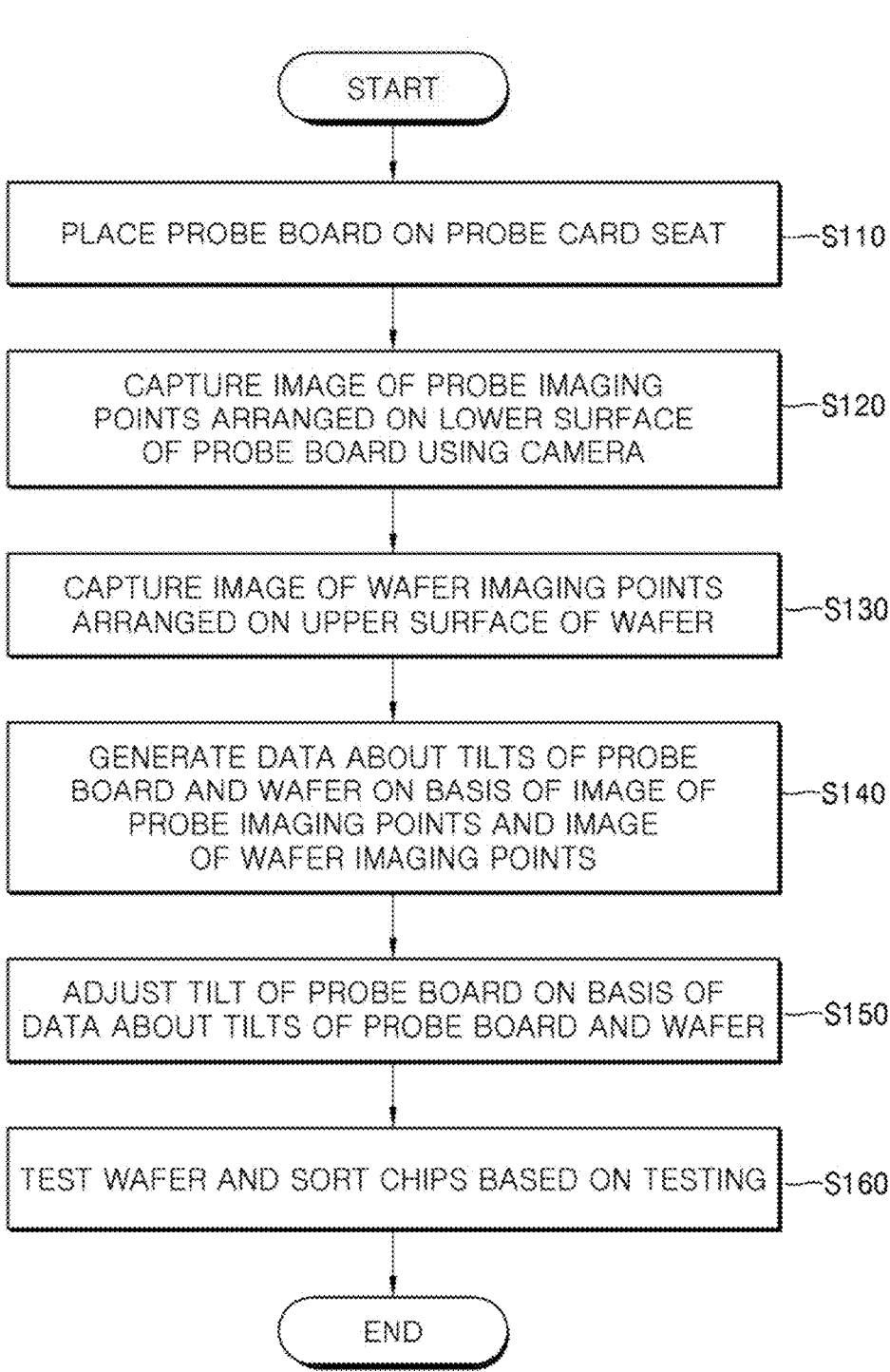
FIG. 7 is a flowchart of a method of controlling the wafer testing apparatus according to an embodiment.
Figure 8A:
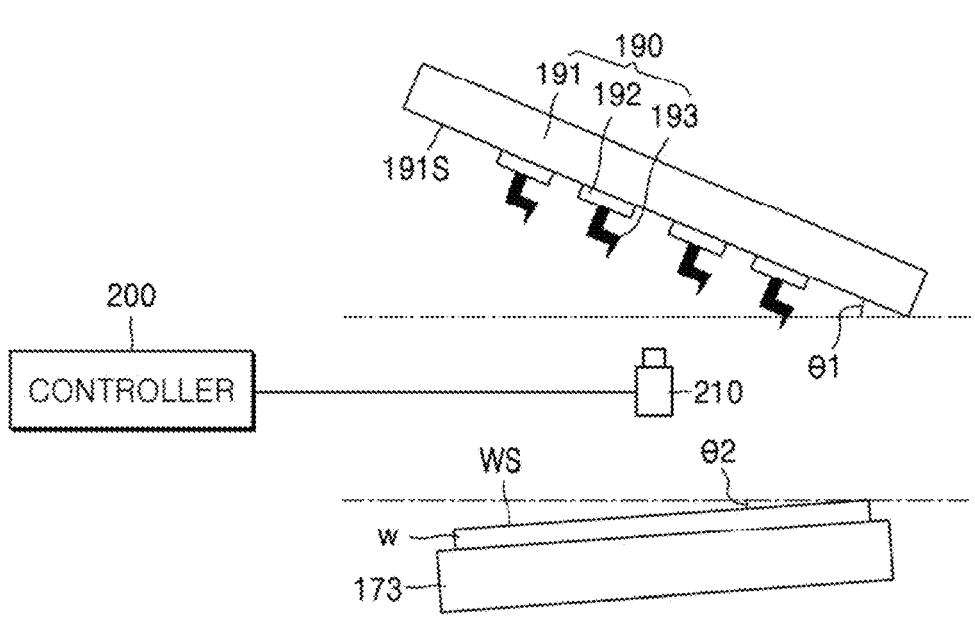
FIGS. 8A to 8C are cross-sectional views sequentially illustrating the method of controlling the wafer testing apparatus, according to FIG. 7.
Figure 8B:
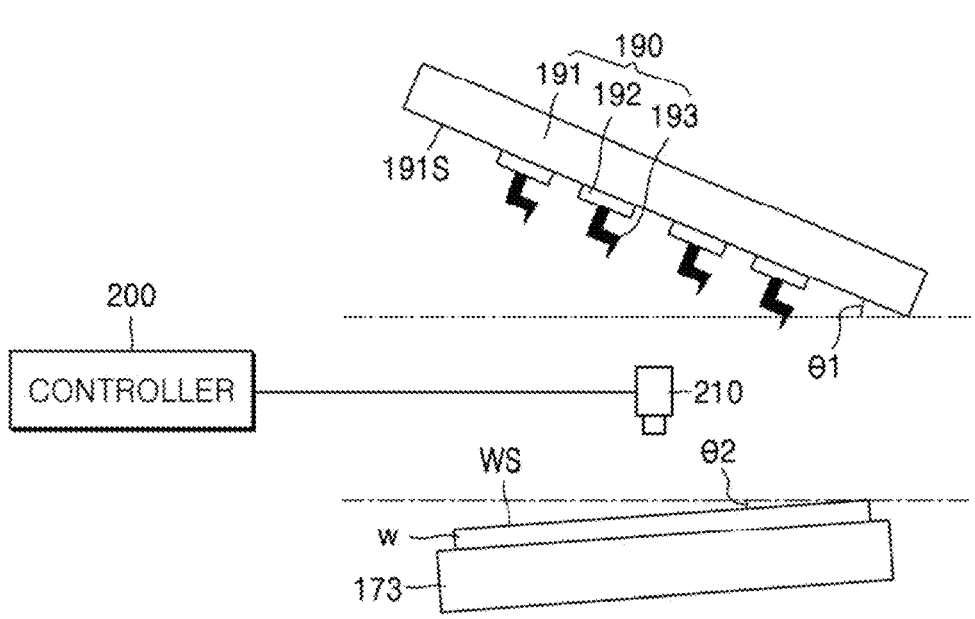
Figure 8C:
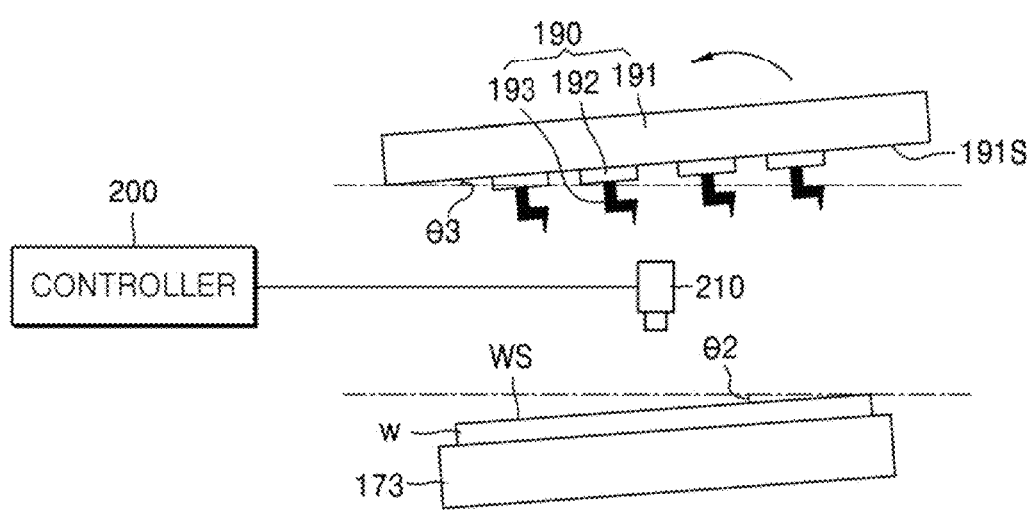

FIG. 7 is a flowchart of a method of controlling the wafer testing apparatus, according to some example embodiments. FIGS. 8A to 8C are cross-sectional views sequentially illustrating the method of controlling the wafer testing apparatus, according to FIG. 7. For convenience of description, the method of controlling the wafer testing apparatus is described below with reference to FIG. 3 together.

Referring to FIGS. 3, 7, and 8A, the probe card 190 may be placed on the probe card seat 143 (S110). The probe card seat 143 may have a cavity, and the cavity may have an area larger than the largest surface of the probe board 191. Accordingly, the probe card 190 may be positioned in the cavity of the probe card seat 143. However, according to various example embodiments, the probe card seat 143 may include a hole communicating with the chamber 20, and the diameter of the hole is smaller than the diameter of the lower surface 191S of the probe board 191 or the length of a diagonal line thereof. Therefore, the probe card 190 may be stably placed on the probe card seat 143 without falling into the hole thereof. The probe board 191 of the probe card 190 may be disposed on the driving device 220 installed in a groove of the probe card seat 143, and the DUTs 192 and the probe pins 193 may face the stage supporting part 185 through the hole.

Subsequently, the image of the plurality of probe imaging points P1, P2, and P3 arranged on the lower surface 191S of the probe board 191 may be captured using the camera 210 (S120). According to some example embodiments, the camera 210 may be disposed between the probe board 191 and the wafer W placed on the wafer chuck 173. The plurality of DUTs 192 and the plurality of probe pins 193 may be arranged on the lower surface 191S of the probe board 191. As illustrated in FIG. 8B, referring to FIG. 3 together, the probe board 191 may be tilted by a first angle θ1 relative to a virtual horizontal plane parallel to the lower surface 20S of the chamber 20 and the wafer W may be tilted by a second angle θ2 relative to the virtual horizontal plane. FIG. 8B illustrates that the first angle θ1 is greater than the second angle θ2, but example embodiments are not necessarily limited thereto. According to various example embodiments, the second angle θ2 may be greater than the first angle θ1. The camera 210 may be configured to obtain image information by capturing the image of the plurality of probe imaging points P1, P2, and P3 on the lower surface 191S of the probe board 191 illustrated in FIG. 4.

Subsequently, referring to FIGS. 7 and 8B, the image of the plurality of wafer imaging points W1, W2, and W3 arranged on the upper surface WS of the wafer W may be captured using the camera 210 (S130). The camera 210 may be configured to be rotated by the camera supporting part 212. After capturing the image of the probe imaging points P1, P2, and P3 on the lower surface 191S of the probe board 191, the camera 210 may be rotated by 180 degrees or an angle equivalent thereto and face the upper surface WS of the wafer W. The camera 210 may be configured to obtain image information by capturing the image of the plurality of wafer imaging points W1, W2, and W3 on the upper surface WS of the wafer W illustrated in FIG. 5.

The camera 210 may transmit the image information of the plurality of probe imaging points P1, P2, and P3 and the image of the plurality of wafer imaging points W1, W2, and W3 to a controller 230 (see FIG. 6.) electrically connected to the camera 210. Here, according to some example embodiments, the camera 210 may transmit the image of the plurality of probe imaging points P1, P2, and P3 to the controller 200 after capturing the image of the plurality of probe imaging points P1, P2, and P3 and before capturing the image of the wafer imaging points W1, W2, and W3. Also, the camera 210 may transmit the image of the plurality of probe imaging points P1, P2, and P3 to the controller 200 after completely capturing the image of the plurality of wafer imaging points W1, W2, and W3.

Subsequently, referring to FIGS. 7 and 8C, the controller 200 may generate data about the tilts of the probe board 191 and the wafer W on the basis of the image of the plurality of probe imaging points P1, P2, and P3 and the image of the plurality of wafer imaging points W1, W2, and W3 received from the camera 210 (S140). Because the data generation and transmission of the controller 200 have been described in detail with reference to FIG. 6, repeated descriptions thereof are omitted.

Subsequently, referring back to FIGS. 7 and 8C, the controller 200 may adjust the tilt of the probe card 190 on the basis of the data about the tilts of the probe board 191 and the wafer W. Specifically, the controller 200 controls the driving device 220 on the basis of the data about the tilts of the probe board 191 and the wafer W to thereby adjust the tilt of the probe card 190 (S150). As illustrated in FIG. 8C, when the probe card 190 rotates, the lower surface of the probe card 190 and the upper surface WS of the wafer W placed on the wafer chuck 173 may be aligned with each other in parallel. The controller 200 may rotate the probe card 190 by using not only the data about the initial tilt (e.g., the first angle θ1 of FIG. 8A) of the probe card 190 but also the data about the tilt (e.g., the second angle θ2 of FIG. 8A) of the wafer W placed on the wafer chuck 173. When the probe card 190 rotates, the tilt of the lower surface of the probe card 190 relative to the virtual horizontal plane parallel to the lower surface 20S of the chamber 20 may be defined as a third angle θ3. Here, the third angle θ3 may be substantially same as the second angle θ2 defined as the tilt of the wafer W.

Subsequently, the controller 200 may test and/or probe the semiconductor devices on the wafer W, and may sort the semiconductor devices based on the testing (S160). In some example embodiments, by adjusting the tilt of the probe card 190, a more accurate contact may be made to the semiconductor devices on the wafer W. The probing of the wafer W may enable a sort and a determination of semiconductor devices that perform within various expectations. In some example embodiments, certain semiconductor devices on the wafer W may be repaired, based on the tilt of the probe card 190; example embodiments are not limited thereto.

Figure 9:
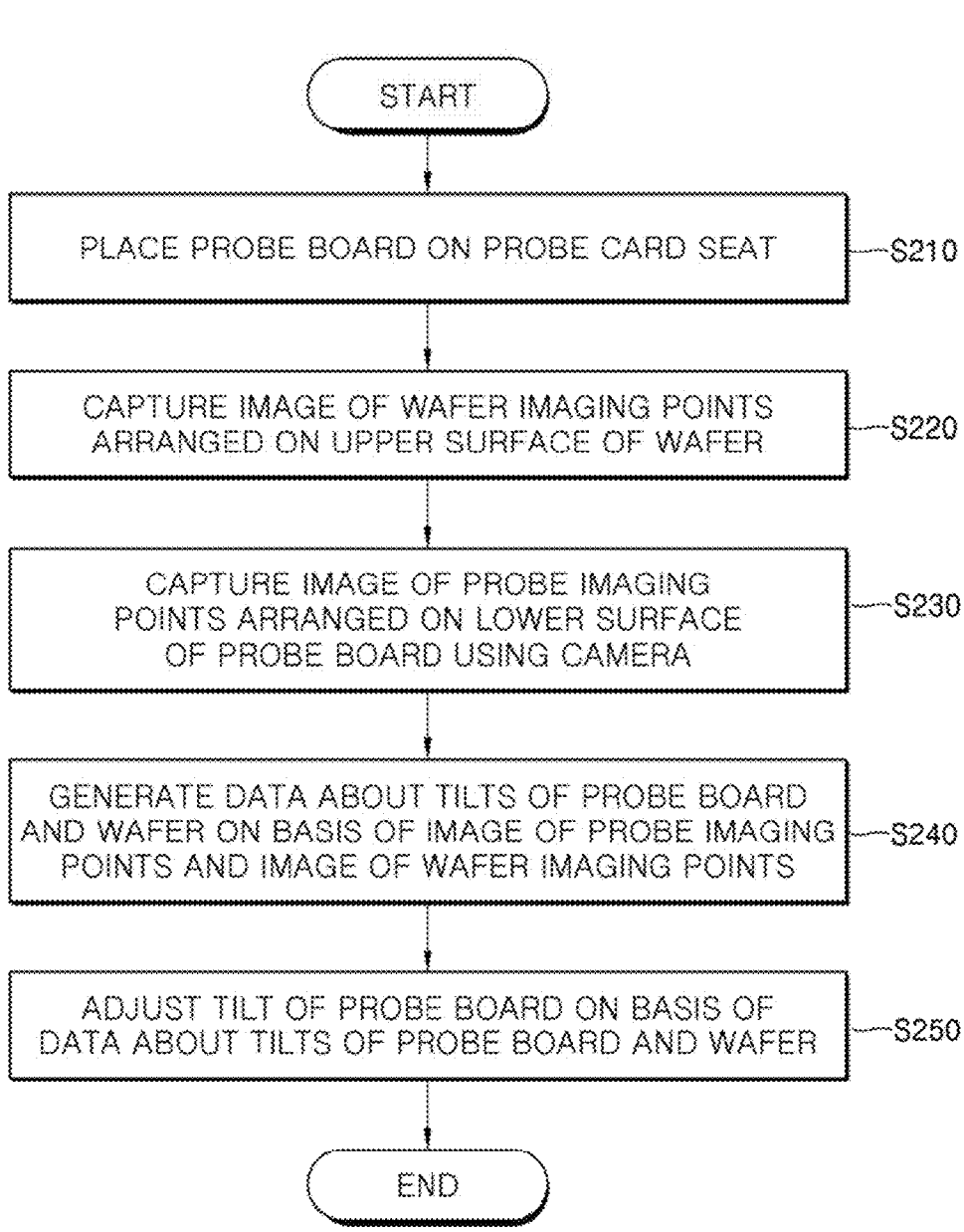
FIG. 9 is a flowchart of a method of controlling the wafer testing apparatus according to another embodiment.

FIG. 9 is a flowchart of a method of controlling the wafer testing apparatus, according to another embodiment, and FIGS. 10A to 10D are cross-sectional views sequentially illustrating the method of controlling the wafer testing apparatus, according to FIG. 8.

The flowchart of FIG. 9 of the control method of the wafer testing apparatus and the flowchart of FIG. 7 of the control method of the wafer testing apparatus may have only a difference in the sequence relationship between capturing the image of the probe imaging points P1, P2, and P3 and capturing the image of the wafer imaging points W1, W2, and W3 by using the camera 210. Therefore, detailed descriptions of the control method previously given with reference to FIGS. 7 and 8A to 8C is omitted.

Figure 10A:
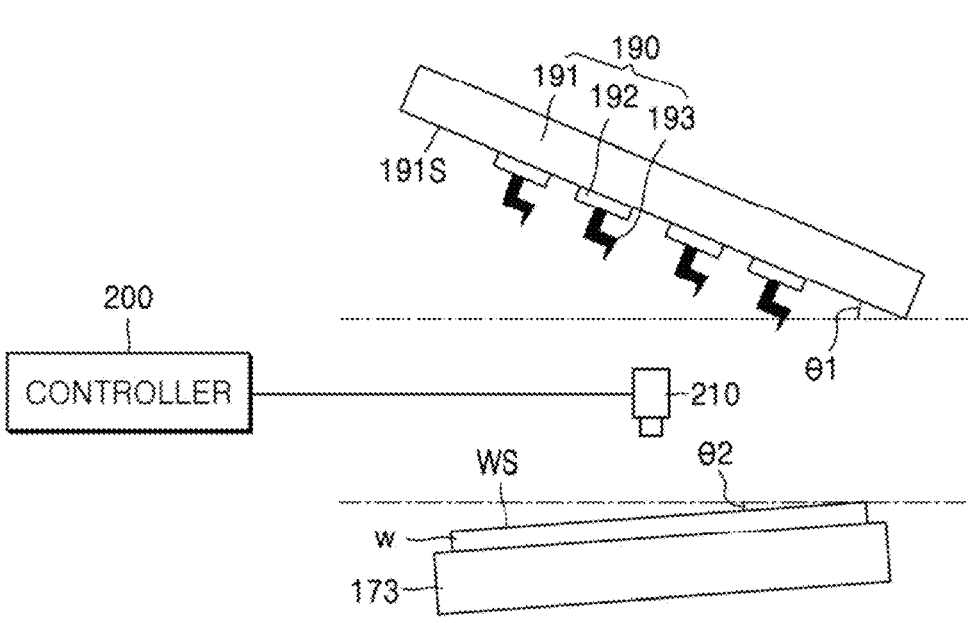
FIGS. 10A to 10D are cross-sectional views sequentially illustrating the method of controlling the wafer testing apparatus, according to FIG. 8.

Referring to FIGS. 9 and 10A, the probe card 190 may be placed on the probe card seat 143 (S210). Subsequently, the image of the plurality of wafer imaging points W1, W2, and W3 arranged on the upper surface WS of the wafer W may be captured using the camera 210 (S220). Unlike the control method of the wafer testing apparatus described with reference to FIGS. 7 and 8A to 8C, the image of the plurality of wafer imaging points W1, W2, and W3 may be captured prior to the image of the plurality of probe imaging points P1, P2, and P3.

Figure 10B:
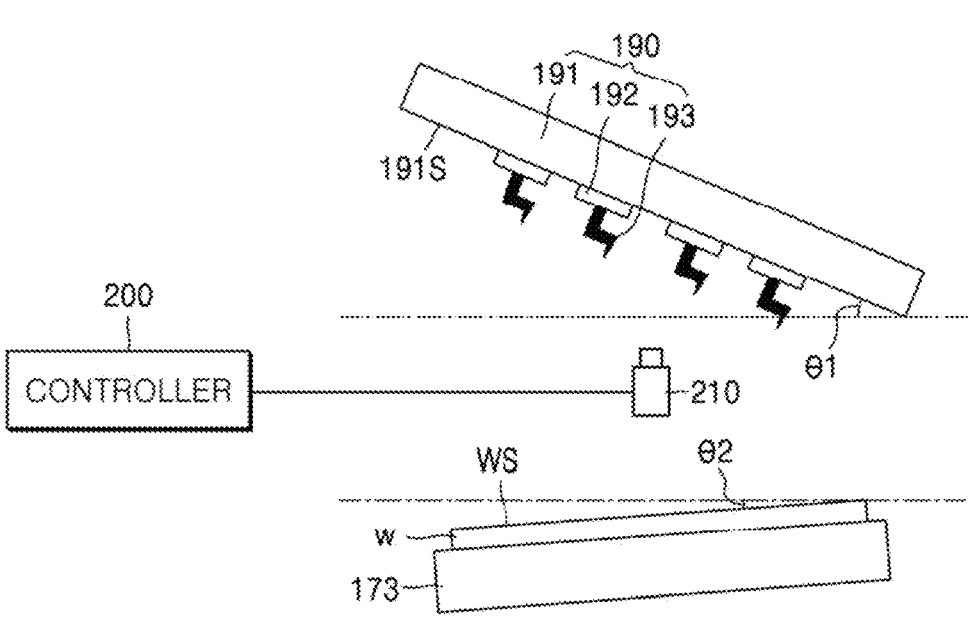

Subsequently, referring to FIGS. 9 and 10B, the image of the plurality of probe imaging points P1, P2, and P3 arranged on the lower surface 191S of the probe board 191 may be captured using the camera 210 (S230). The camera 210 may be configured to be rotated by the camera supporting part 212. After capturing the image of the wafer imaging points W1, W2, and W3 on the upper surface WS of the wafer W, the camera 210 may be rotated by 180 degrees or an angle equivalent thereto and face the lower surface 191S of the probe board 191.

Figure 10C:
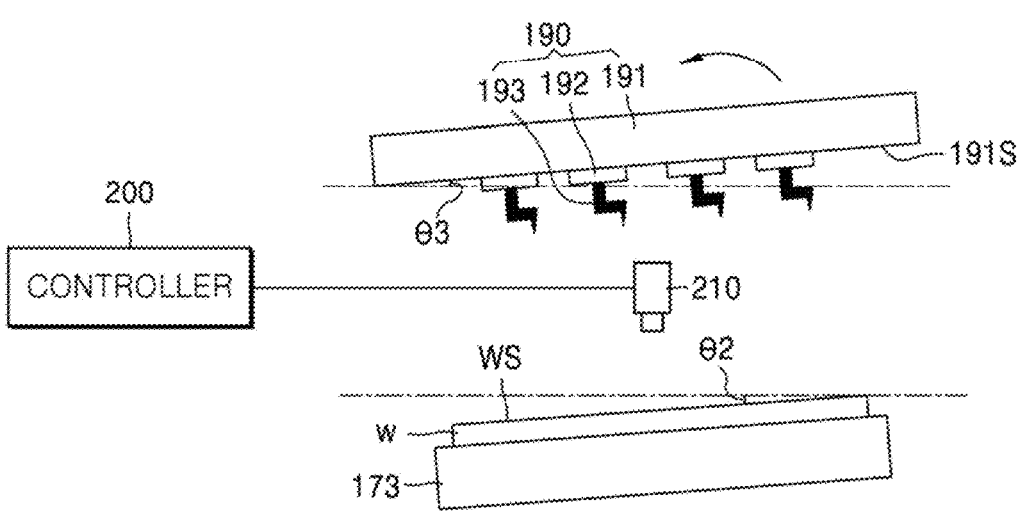

Subsequently, referring to FIGS. 9 and 10C, the controller 200 may generate data about the tilts of the probe board 191 and the wafer W on the basis of the image of the plurality of probe imaging points P1, P2, and P3 and the image of the plurality of wafer imaging points W1, W2, and W3 received from the camera 210 (S240). Because the data generation and transmission of the controller 200 have been described in detail with reference to FIG. 6, repeated descriptions thereof are omitted.

Subsequently, the controller 200 may adjust the tilt of the probe card 190 on the basis of the data about the tilts of the probe board 191 and the wafer W. Specifically, the controller 200 controls the driving device 220 on the basis of the data about the tilts of the probe board 191 and the wafer W to thereby adjust the tilt of the probe card 190.

Figure 10D:
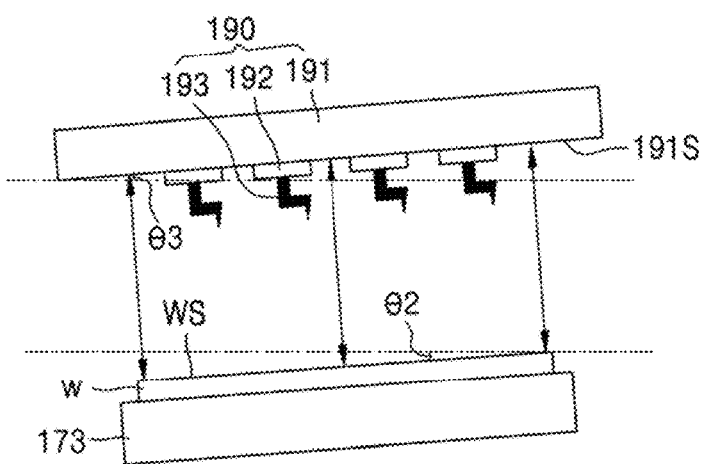

Referring to FIG. 10D, an angle between a lower surface 190S of the probe card 190, of which the tilt has been adjusted, and the virtual horizontal plane parallel to the lower surface 20S of the chamber 20 may be defined as a third angle θ3. Here, the distance between the upper surface WS of the wafer W and the lower surface 190S of the probe card 190 may be constant according to the positions of the upper surface WS of the wafer W.

Figure 11:
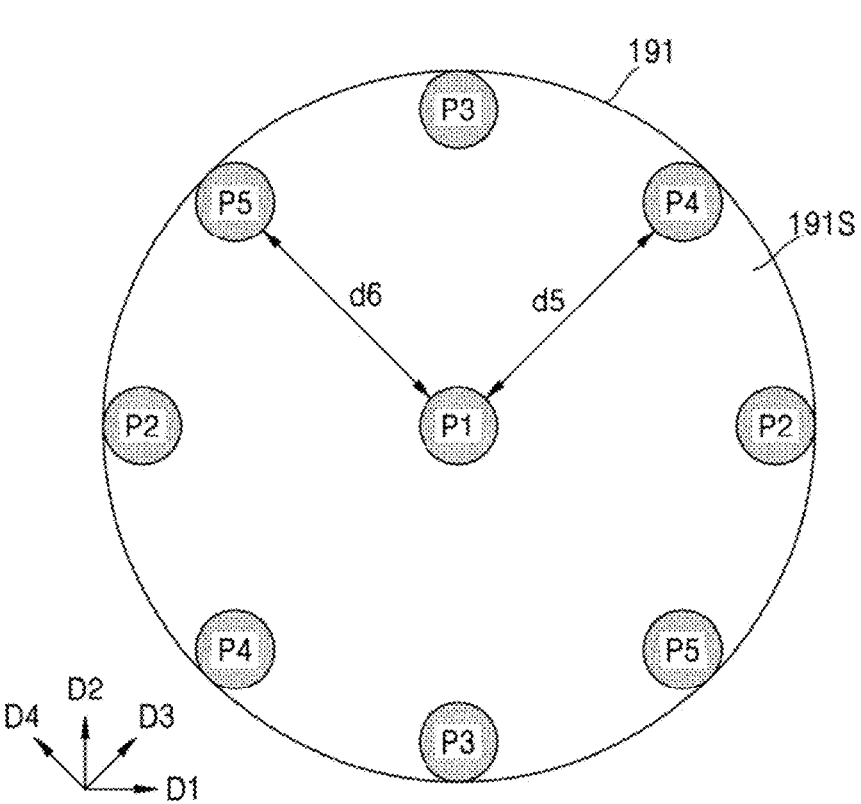
FIG. 11 is a plan view illustrating a plurality of probe imaging points arranged on the lower surface of a probe board according to another embodiment.

FIG. 11 is a plan view illustrating a plurality of probe imaging points arranged on the lower surface of a probe board according to another embodiment. A plurality of probe imaging points P1, P2, P3, P4, and P5 arranged on the lower surface 191S of the probe board 191 illustrated in FIG. 11 are substantially the same as or similar to the plurality of probe imaging points P1, P2, and P3 illustrated in FIG. 4, except that a fourth probe imaging point P4 and a fifth probe imaging point P5 are further provided. Therefore, descriptions of the components illustrated in FIG. 4 are omitted.

Referring to FIG. 11, the plurality of probe imaging points P1, P2, P3, P4, and P5 according to some example embodiments may include a pair of fourth probe imaging points P4 and a pair of fifth probe imaging points P5. The pair of fourth probe imaging points P4 may be arranged in a third direction D3 oblique to both the first direction D1 and the second direction D2 with the first probe imaging point P1 therebetween at the outer circumference of the lower surface 191S of the probe board 191. In this case, each of the pair of fourth probe imaging points P4 may be spaced from the first probe imaging point P1 by a fifth distance d5 in the third direction D3. The pair of fifth probe imaging points P5 may be arranged in a fourth direction D4 perpendicular to the third direction D3 with the first probe imaging point P1 therebetween at the outer circumference of the lower surface 191S of the probe board 191. In this case, each of the pair of fifth probe imaging points P5 may be spaced from the first probe imaging point P1 by a sixth distance d6 in the fourth direction D4.

Figure 12:
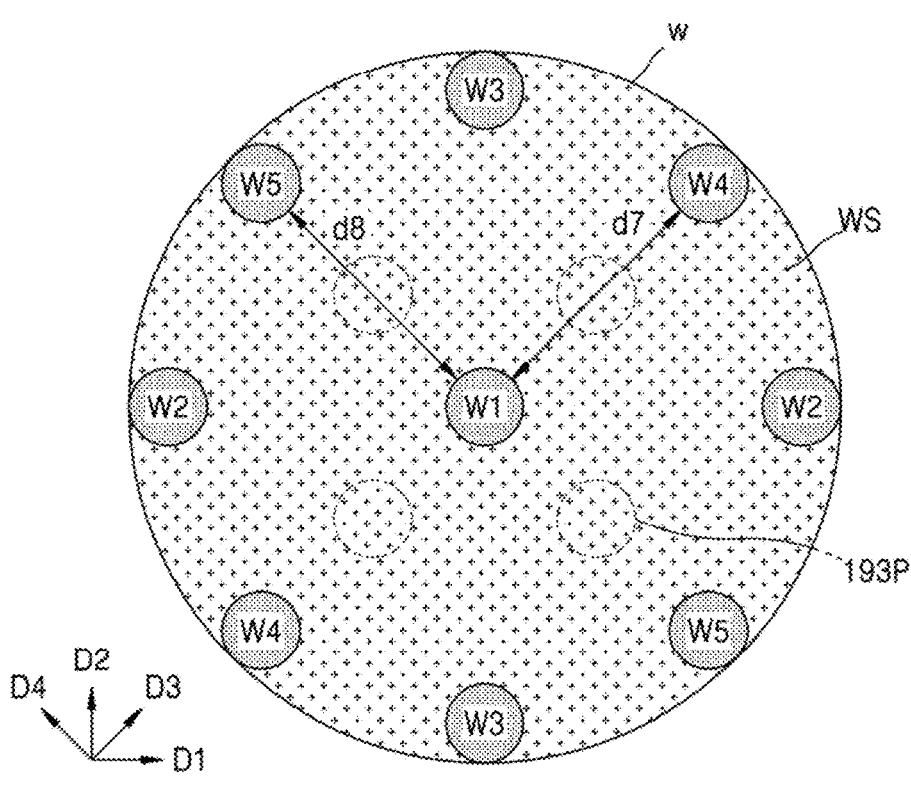
FIG. 12 is a plan view illustrating a plurality of wafer imaging points arranged on the upper surface of a wafer according to another embodiment.

FIG. 12 is a plan view illustrating a plurality of wafer imaging points arranged on the upper surface of a wafer according to various example embodiments embodiment. A plurality of wafer imaging points W1, W2, W3, W4, and W5 arranged on the upper surface WS of the wafer W illustrated in FIG. 12 are substantially the same as or similar to the plurality of wafer imaging points W1, W2, and W3 illustrated in FIG. 5, except that a fourth wafer imaging point W4 and a fifth wafer imaging point W5 are further provided. Therefore, descriptions of the components illustrated in FIG. 5 are omitted.

Referring to FIG. 12, the plurality of wafer imaging points W1, W2, W3, W4, and W5 according to some example embodiments may include a pair of fourth wafer imaging points W4 and a pair of fifth wafer imaging points W5. The pair of fourth wafer imaging points W4 may be arranged in a third direction D3 oblique to both the first direction D1 and the second direction D2 with the first wafer imaging point W1 therebetween at the outer circumference of the upper surface WS of the wafer W. In this case, each of the pair of fourth wafer imaging points W4 may be spaced from the first wafer imaging point W1 by a seventh distance d7 in the third direction D3. The pair of fifth wafer imaging points W5 may be arranged in a fourth direction D4 perpendicular to the third direction D3 with the first wafer imaging point W1 therebetween at the outer circumference of the upper surface WS of the wafer W. In this case, each of the pair of fifth wafer imaging points W5 may be spaced from the first wafer imaging point W1 by an eighth distance d8 in the fourth direction D4.

According to some example embodiments, a plurality of pin contact points 193P may be arranged on the upper surface WS of the wafer W. The pin contact points 193P may represent points at which the probe pins 193 are brought into contact with the upper surface WS of the wafer W. As illustrated in FIG. 12, the pin contact points 193P may not overlap the fourth and fifth wafer imaging points W4 and W5. However, example embodiments are not necessarily limited thereto, and the pin contact points 193P may overlap the fourth and fifth wafer imaging points W4 and W5 according to embodiments.

Figure 13:
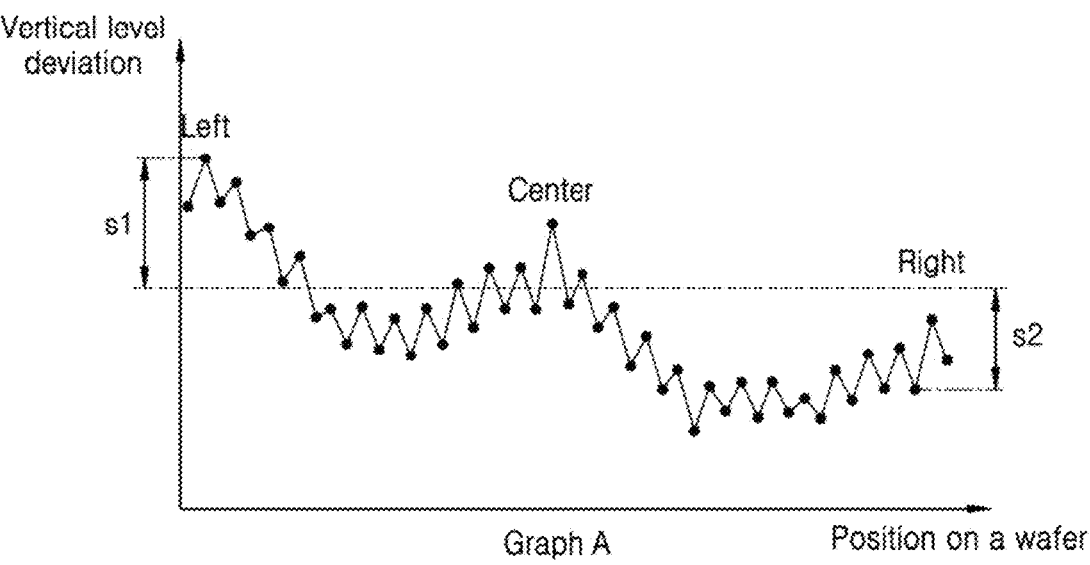
FIGS. 13 and 14 are graphs for explaining the effect of the wafer testing apparatus according to various example embodiments.
Figure 14:
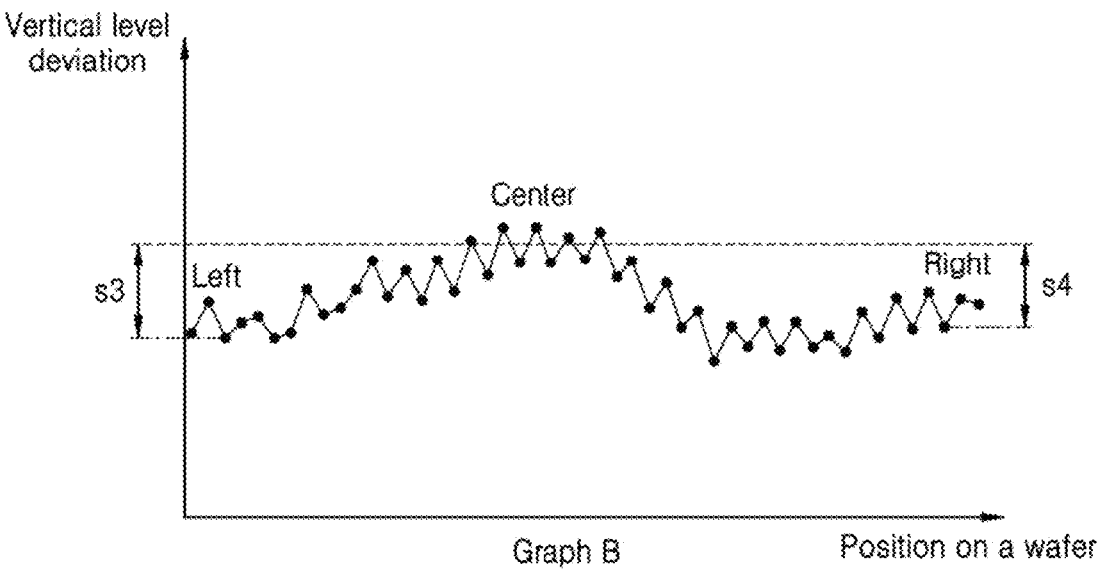

FIGS. 13 and 14 are graphs for explaining the effect of the wafer testing apparatus according to various example embodiments. Specifically, FIG. 13 shows a perpendicular distance between a probe board and a wafer according to positions on the upper surface WS of the wafer when a wafer testing apparatus according to some example embodiments is not used. FIG. 14 shows a perpendicular distance between the probe board and the wafer according to positions on the upper surface WS of the wafer when the wafer testing apparatus according to some example embodiments is used.

Referring to FIGS. 13 and 14, in Graph A illustrated in FIG. 13, the horizontal axis represents the position on the upper surface WS of the wafer W and the vertical axis represents the perpendicular distance between the upper surface WS of the wafer W and the lower surface 191S of the probe board 191. When the probe board 191 of the probe card 190 is aligned with the upper surface WS of the wafer W and the probe pins 193 are brought into contact with the wafer W, the upper surface WS of the wafer W and the lower surface 191S of the probe board 191 may be spaced from each other by a certain distance. As illustrated in Graph A of FIG. 13, on the basis of the perpendicular distance between the center point of the upper surface WS of the wafer W and the lower surface 191S of the probe board 191, the perpendicular distance from the left side of the upper surface WS of the wafer W to the lower surface 191S of the probe board 191 may be a first distance s1. Also, on the basis of the perpendicular distance between the center point of the upper surface WS of the wafer W and the probe board 191, the perpendicular distance from the right side of the upper surface WS of the wafer W to the lower surface 191S of the probe board 191 may be a second distance s2.

Also in Graph B illustrated in FIG. 14, the horizontal axis represents the position on the upper surface WS of the wafer W and the vertical axis represents the perpendicular distance between the upper surface WS of the wafer W and the lower surface 191S of the probe board 191. When the wafer testing apparatus according to some example embodiments is used, on the basis of the perpendicular distance between the center point of the upper surface WS of the wafer W and the lower surface 191S of the probe board 191, the perpendicular distance from the left side of the upper surface WS of the wafer W to the lower surface 191S of the probe board 191 may be a third distance s3. In this case, the third distance s3 may be less than the first distance s1 illustrated in FIG. 13. Also, on the basis of the perpendicular distance between the center point of the upper surface WS of the wafer W and the lower surface 191S of the probe board 191, the perpendicular distance from the right side of the upper surface WS of the wafer W to the lower surface 191S of the probe board 191 may be a fourth distance s4. In this case, the fourth distance s4 may be less than the second distance s2 illustrated in FIG. 13. That is, when the wafer testing apparatus according to some example embodiments is used, the probe board 191 may be more precisely aligned with the wafer W at the outer circumference of the lower surface 191S of the probe board 191.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While inventive concepts have been particularly shown and described with reference to embodiments thereof, it will be understood that various changes in form and details may be made therein without departing from the spirit and scope of the following claims. Additionally, example embodiments are not necessarily mutually exclusive with one another. For example, some example embodiments may include one or more features described with reference to one or more drawings, and may also include one or more other features described with reference to one or more other drawings.

What is claimed is:

1. A wafer testing apparatus for testing a wafer in chamber providing a space for testing electrical properties of semiconductor devices on the wafer, the wafer testing apparatus comprising:

a probe board above the chamber;
a wafer chuck below the probe board and configured to support the wafer;
a camera between the probe board and the wafer chuck and configured to capture images of probe imaging points arranged on a lower surface of the probe board and a plurality of wafer imaging points arranged on an upper surface of the wafer; and
a controller electrically connected to the camera and configured to adjust a tilt of the probe board on the basis of image information acquired by the camera,
wherein the probe imaging points comprise a plurality of probe outer imaging points arranged in a rhombic pattern on the lower surface of the probe board, and the plurality of wafer imaging points comprise a plurality of wafer outer imaging points arranged in a rhombic pattern on the upper surface of the wafer.

2. The wafer testing apparatus of claim 1, further comprising:
a driving device electrically connected to the controller,
wherein the driving device is configured to adjust the tilt of the probe board on the basis of a horizontal line parallel to a lower surface of the chamber.

3. The wafer testing apparatus of claim 2, wherein the controller is electrically connected to the driving device and configured to transmit an electrical signal to the driving device to adjust the tilt of the probe board.

4. The wafer testing apparatus of claim 1, wherein the probe imaging points further comprise a probe central imaging point between the plurality of probe outer imaging points on the lower surface of the probe board and spaced from each of the plurality of probe outer imaging points by a same distance.

5. The wafer testing apparatus of claim 1, wherein the plurality of wafer imaging points further comprise a wafer central imaging point that between the plurality of wafer outer imaging points on the upper surface of the wafer and spaced from each of the plurality of wafer outer imaging points by a same distance.

6. The wafer testing apparatus of claim 1, further comprising:
a plurality of probe pins arranged on the lower surface of the probe board,
wherein the plurality of probe pins are configured to come into contact with the upper surface of the wafer and to transmit an electrical signal received from the probe board to the wafer.

7. The wafer testing apparatus of claim 6, wherein points, at which the plurality of probe pins come into contact with the upper surface of the wafer, do not overlap the plurality of wafer imaging points.

8. The wafer testing apparatus of claim 1, wherein the camera is configured to capture an image of one of the probe imaging points or of the plurality of wafer imaging points and then capture an image of the other one of the probe imaging points or of the plurality of wafer imaging points.

9. The wafer testing apparatus of claim 1, wherein
the probe imaging points are adjacent to an outer circumference of the lower surface of the probe board, and
the plurality of wafer imaging points are adjacent to an outer circumference of the upper surface of the wafer.

10. A wafer testing apparatus for a wafer to be tested in a chamber providing a space for testing electrical properties of semiconductor devices formed on the wafer, the wafer testing apparatus comprising:

a probe board arranged to be above the wafer and having a lower surface to face the wafer;

a camera disposed the probe board and configured to acquire image information by capturing images of a plurality of wafer imaging points arranged on an upper surface of the wafer and a plurality of probe imaging points arranged on the lower surface of the probe board;

a driving device configured to adjust a tilt of the probe board; and a controller configured to transmit an electrical signal to the driving device on the basis of the image information acquired by the camera, wherein the plurality of probe imaging points comprise, a first probe imaging point located at a center of the lower surface of the probe board, a pair of second probe imaging points arranged in a first direction with the first probe imaging point therebetween and at an outer circumference of the lower surface of the probe board, and a pair of third probe imaging points arranged in a second direction perpendicular to the first direction with the first probe imaging point therebetween and at an outer circumference of the lower surface of the probe board.

11. The wafer testing apparatus of claim 10, wherein the pair of second probe imaging points are spaced from the first probe imaging point by a same first distance, and the pair of third probe imaging points are spaced from the first probe imaging point by a same second distance.

12. The wafer testing apparatus of claim 10, wherein the plurality of wafer imaging points comprise:

a first wafer imaging point located at a center of the upper surface of the wafer;

a pair of second wafer imaging points arranged in the first direction with the first wafer imaging point therebetween and at the outer circumference of the upper surface of the wafer; and a pair of third wafer imaging points arranged in the second direction perpendicular to the first direction with the first wafer imaging point therebetween and at the outer circumference of the upper surface of the wafer.

13. The wafer testing apparatus of claim 12, wherein the plurality of wafer imaging points further comprise:

a pair of fourth wafer imaging points arranged in a third direction oblique to both the first direction and the second direction with the first wafer imaging point therebetween and at the outer circumference of the upper surface of the wafer; and a pair of fifth wafer imaging points arranged in a fourth direction perpendicular to the third direction with the first wafer imaging point therebetween and at the outer circumference of the upper surface of the wafer.

14. The wafer testing apparatus of claim 10, wherein the plurality of probe imaging points further comprise:

a pair of fourth probe imaging points arranged in a third direction oblique to both the first direction and the second direction with the first probe imaging point therebetween and at the outer circumference of the lower surface of the probe board; and a pair of fifth probe imaging points arranged in a fourth direction perpendicular to the third direction with the first probe imaging point therebetween and at the outer circumference of the lower surface of the probe board.

15. The wafer testing apparatus of claim 10, wherein the controller comprises:

a first control module connected to the camera and configured to generate first data on the basis of the images acquired by the camera;

a second control module configured to receive the first data from the first control module and to generate, on the basis of the first data, second data about a first angle by which the probe board tilts and a second angle by which the wafer tilts; and a third control module configured to receive second data about the first angle and the second angle and to control the driving device.

16. The wafer testing apparatus of claim 15, wherein each of the first angle and the second angle comprises a tilt angle relative to a plane parallel to a lower surface of the chamber.

17. The wafer testing apparatus of claim 10, wherein at least one of the camera is configured to capture the image of the wafer after capturing the image of the plurality of probe imaging points, or the camera is configured to capture the image of the plurality of probe imaging points after capturing the image of the wafer.

18. A method of controlling a wafer testing apparatus for testing electrical properties of semiconductor devices formed on a wafer, the method comprising:

placing a probe board on a probe card seat;

capturing an image of probe imaging points arranged on a lower surface of the probe board using a camera positioned between the probe board and the wafer;

capturing an image of wafer imaging points arranged on an upper surface of the wafer using the camera; and generating data about tilts of the probe board and the wafer on the basis of the image of the probe imaging points and the image of the wafer imaging points acquired by the camera.

19. The method of claim 18, further comprising:

using a driving device to adjust a tilt of the probe board on the basis of the data about the tilts of the probe board and the wafer.

20. The method of claim 18, wherein the probe imaging points comprise:

a first probe imaging point at a center of the probe board on the lower surface of the probe board;

a pair of second probe imaging points arranged in a first direction with the first probe imaging point therebetween and at an outer circumference of the lower surface of the probe board; and a pair of third probe imaging points arranged in a second direction perpendicular to the first direction with the first probe imaging point therebetween and at the outer circumference of the lower surface of the probe board, wherein the wafer imaging points comprise, a first wafer imaging point located at a center of the wafer on the upper surface of the wafer, a pair of second wafer imaging points arranged in the first direction with the first wafer imaging point therebetween and at the outer circumference of the upper surface of the wafer, and a pair of third wafer imaging points arranged in the second direction perpendicular to the first direction with the first wafer imaging point therebetween and at the outer circumference of the upper surface of the wafer.

* * * * *